(12) United States Patent
Yatsuda et al.

(10) Patent No.: US 6,321,444 B1
(45) Date of Patent: Nov. 27, 2001

(54) METHOD OF MAKING SURFACE ACOUSTIC WAVE DEVICE

(75) Inventors: Hiromi Yatsuda; Hiroaki Iijima; Nobuhiro Mineshima, all of Mitaka (JP)

(73) Assignee: Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 09/546,769

(22) Filed: Apr. 11, 2000

(51) Int. Cl.$^7$ ........................................ H05K 3/30
(52) U.S. Cl. ................................. 29/832; 29/594
(58) Field of Search ............................. 29/832, 840, 846, 29/825, 594

(56) References Cited

FOREIGN PATENT DOCUMENTS 61-274506 * 12/1986 (JP) .
10-145167    5/1998 (JP) .

OTHER PUBLICATIONS

Excerpt translation of "Fundamentals of Ultrafine Processing" Semiconductor Fabrication Technology published on Mar. 25, 1993.

"Frequency Trimming of SAW Devices" Takehiko Uno, Kanagawa Institute of Technology, Atsugi, Kanagawa 243–02, Japan.

"Miniaturized SAW Filters Using a Flip–Chip Technique" Hiromi Yatsuda, Taira Horishima, Takeshi Eimura and Tadao Ooiwa, IEEE Transactions on Ultrasonics, Ferroelectrics and Frequency Control, vol. 43, No. 1, Jan. 1996.

* cited by examiner

Primary Examiner—Carl J. Arbes
(74) Attorney, Agent, or Firm—Samuels, Gauthier & Stevens, LLP

(57) ABSTRACT

In a surface-acoustic-wave (SAW) device and method of fabricating the same, a SAW chip is flip-chip mounted in a package. The package has a window facing an electrode formed surface of the SAW chip. After the SAW chip is mounted, the in-process item is inserted into reactive ion etching equipment, with the window open. The substrate or electrodes of the SAW chip is etched by an etching gas introduced into the ion etching equipment. Films may be formed on the electrode formation surface, in place of etching. Thus, variation in characteristics stemming from variations in manufacturing processes can be suppressed.

9 Claims, 5 Drawing Sheets

METHOD OF MAKING SURFACE ACOUSTIC WAVE DEVICE

BACKGROUND OF THE INVENTION

1. Field of the Invention

The present invention relates to a flip-chip mounted surface acoustic wave (SAW) device and a method of producing the same.

2. Description of Related Art

Conventionally, surface-acoustic-wave (SAW) devices are fabricated through a series of steps of adhesively fixing a SAW chip on the inside bottom surface of a package and then interconnecting the bonding pads formed in the package and the bonding pads on the surface of the SAW chip through the wire bonding. However, these wire-bonded-type SAW devices have a problem in that the adhesive agent used for fixing the SAW chip leads to variations in characteristic after fabrication. In contrast, flip-chip mounted-type SAW devices are fabricated through the following steps. That is, bumps made of a conductor such as gold are placed on conductive pads of a SAW chip. The SAW chip is placed on the bottom surface inside the package, with the bump formed surface (electrode formed surface) facing the bottom surface inside the package (die attachment surface). The intermediate structure is subjected to heating, pressure, or ultrasonics. Thus, the conductive pads on the die attachment surface and those on the electrode formed surface are electrically connected and mechanically fixed by the bumps. This process does not require any adhesive agent. Hence, the resultant SAW device has less variation in characteristics than do conventional wire-bonded-type SAW devices.

FIG. 7 illustrates the configuration of a flip-chip mounted SAW device. Referring to FIG. 7, electrodes or various conductive layers (not shown) are formed on the electrode formed surface 10a of a SAW chip 10. The electrodes may be ones that excite a surface of a Piezoelectric substrate of, e.g. quartz crystal, by applied electrical signals to generate surface acoustic waves. The electrodes may receive surface acoustic waves and produce electrical signals or may reflect surface acoustic waves in a specific direction. Moreover, conductive pads (not shown) electrically connected with the electrodes on the electrode formed surface 10a are connected to and fixed to the package 12. The package 12 has a recess to accommodate the SAW chip 10. Conductive pads (not shown) are formed on the bottom surface, or the die attachment surface 12a, so as to face bumps 14 when the chip 10 is accommodated in the recess. Footprints 12b, being conductors for external connection, are formed on the package 12. The footprints 12b are electrically connected to conductive pads on the die attachment surface 12b through conductors (not shown) penetrating the package 12.

In the fabrication of the SAW device in FIG. 7, bumps 14 made of a metal such as gold are first placed on the conductive pads formed on the electrode formed surface 10a. The SAW chip 10 is placed in the recess of the package 12, with the electrode formed surface 10a downward in FIG. 7. The intermediate structure is subjected to heating, pressure, or ultrasonics. Thus, the conductive pads of the SAW chip 10 are electrically connected and mechanically fixed to the conductive pads on the die attachment surface 12a via the bumps 14. Thereafter, the lid (cover) 12c seals the recess to house the SAW chip 10. The sealing portion 12d, which is a sealing member intervening between the lid 12c and the package 12, is formed by applying heat or pressure. Gold or tin, resin, soldering, glass and so on are among the substances that may be used for the sealing member.

With the package 12 connected and fixed with the bumps 14, the characteristics of the SAW device 10 can be measured with an external measuring device via the footprints 12b before sealing the opening of the package 12. One of the inventors of the present invention also invented the method disclosed in Japanese Patent Laid-Open Publication No. Hei NO. 10-145167 (hereinafter referred to as a previous proposal). According to this method, before the opening of the package 12 is covered with the lid 12c after the bump connection and fixture, focused radiation such as laser light is irradiated from above the back surface of the SAW chip 10 (from the upper orientation in FIG. 7), to adjust the characteristics of the SAW chip 10. Thus, the radiation evaporates the conductive layer or the insulating layer on the electrode formed surface 10a while the characteristics of the in-process item is being measured. Though this process, the device characteristics can be adjusted to suppress and prevent characteristic variations due to conditional deviations in fabrication.

SUMMARY OF THE INVENTION

It is an object of the present invention to provide a flip-chip mounted surface-acoustic-wave device, the characteristics of which can be adjusted during fabrication to suppresschanges in characteristics due to fabrication.

Another object of the present invention is to provide a surface-acoustic-wave device that adopts a devised characteristic adjusting method so that variation in characteristics can be suppressed to a larger degree, compared with the previous proposal.

In order to achieve the above mentioned objectives, a method of fabricating a surface-acoustic-wave device according to the present invention comprises (1) a mounting step of flip-chip mounting a surface-acoustic-wave (SAW) chip within a package, the package having a window for characteristics adjustment in its die attachment surface, and (2) a first adjustment step of adjusting characteristics of an in-process item by an adjustment operation. The adjustment operation may be the introduction of a gas into the package through the window, or may be the beam irradiation onto the electrodes or insulation films on the surface of the SAW chip, or may be the combination thereof.

The gas is introduced, for example, into the package to etch the substrate or electrodes of a SAW chip, or, onto the electrode formed surface of a SAW chip to form (e.g. by CVD) a film relating to surface acoustic wave propagation, or, onto the electrode or insulation film formed on the surface of the SAW chip to change or adjust the quality of the electrode or insulation film. Gas introduction in the preferable embodiment of the present invention can be defined as the introduction of gases which affect the surface-acoustic-wave propagation and thus the characteristics of a SAW device. That is, according to the present invention, since the substrate conditions and the electrode properties of a SAW chip can be changed, characteristics variations such as center frequency variations can be further suppressed and the center frequency can precisely be set to the target frequency. The gas to be introduced may be selected according to whether the substrate is to be etched or not, whether the electrode is to be etched or not, whether the quality of the electrodes or insulation films or not, whether a new film is to be formed, and so on.

According to the present invention, a window for characteristics adjustment is formed on the die attachment surface. Because the die attachment surface must be provided with an area for connecting a SAW chip to the package side, such as a conductive pad area, the window must be smaller than the opening for introducing a SAW chip into the package. The present invention may preferably embodied by effectively utilizing the relationship between the opening area and the window area.

In an example employing a method with a relatively high etching rate, like reactive ion etching wherein a fluorine series gas is used as an etching gas, a case can be considered wherein the substrate or electrodes of a SAW chip is etched to perform the device characteristics adjustment related to the feature of the present invention and wherein the in-process item to be adjusted in characteristics is a SAW device in process for a relatively high frequency band, that is, with fine electrodes. If plasma as used in this specification, comprehensively including excited active species such as ions, electrons, atoms, and radicals in this application) is introduced onto the electrode formed surface of a SAW chip through an opening area as large as the opening for chip accommodation, the etching rapidly advances. Hence, it may be difficult to set the characteristic of an in-process item, e.g. the center frequency of a pass band, to a target value, control is difficult.

According to the present invention, a window with an opening area smaller than that of the opening for chip accommodation is used to introduce gas for characteristics adjustment. Hence, when the substrate or electrodes of a SAW chip are etched using a method with a relatively high etching rate, plasma introduced onto the electrode formed surface of the SAW chip, and thus the etching rate can be suppressed. The present invention can prevent the control difficulty due to the high etching rate in the reactive ion etching by suppressing the etching rate and can accurately and easily adjust the characteristics of SAW devices designed for use in relatively high frequencies. This effect can be further improved by forming the window for characteristics adjustment as a set of plural openings, that is, by making each window smaller by dividing it into plural openings.

The document,"Frequency Trimming of SAW Devices", Takehiko Uno, Kanagawa Institute of Technology, 1994, IEEE Ultrasonic Symposium Proc. Vol. 1, pp. 181–187, Nov. 1–4, 1994, discloses a dry etching technique for adjusting characteristics of SAW devices. In this document, it should be noted that the SAW device is fabricated through the wire bonding, that the electrode formed surface of a SAW chip confronts the opening for chip accommodation, and that the etching gas is introduced through the opening for chip accommodation. Therefore, adjustment of the device characteristics using the technique disclosed in that document is difficult.

In the present invention, however, a first sealing step of sealing a window for characteristics adjustment with a lid for characteristics adjustment window is executed after a first adjustment step while a second sealing step of sealing an opening (used in an assembling step) for introducing a SAW chip in a package with a lid for accommodation opening is executed after at least the assembling step is executed. The fabrication process can be additionally simplified by concurrently performing the second sealing step and the first sealing step. When doing so, the sealing member to seal the opening with a lid for accommodation opening and the sealing member to seal the window with a lid for characteristic adjustment window may be made of the same material. The lid for characteristics adjustment window may partially protrude toward the package. However, such a problem can be avoided by disposing legs for electrical connection and mechanical fixing to external circuit, on the side of the window, and by setting the thickness of the lid for characteristics adjustment to smaller than the height of the legs. In this aspect, the lid for the characteristics adjustment window can be mounted without adversely affecting the external connection and fixture, while a small package size is preserved.

In addition to an introduction of gas through the window, light, such as laser light, or other electromagnetic radiation may be irradiated onto the selected portion of the electrode formed surface of a SAW chip via the window, so that the film qualities of electrodes or the adjacent insulating layers are changed to adjust characteristics of an in-process item. This step, or the second adjustment step, may be executed before the window is covered with a lid. Preferably, the second adjustment step may be performed together with the first adjustment step. The lid for characteristics adjustment window may be made of a substance transparent to light or electromagnetic radiation, then the second adjustment step may be executed after the first sealing step, making it possible to compensate for changes in characteristics, even when characteristics changes occur in the first sealing step. When the measurement step of measuring characteristics of an in-process item is executed after at least the assembling step, the characteristics adjustment amount of an in-process item in the first and/or second adjustment steps can be determined.

Moreover, the present invention may be defined as the invention of a SAW device. The SAW device of the present invention includes a package having a die attachment surface provided inside the package and a SAW chip flip-chip mounted on the die attachment surface in the package. A window for characteristics adjustment is formed in the wall with the die attachment surface. The window is closed with a lid for characteristics adjustment window. Before the window is sealed with the lid, gas is introduced via the window to adjust the characteristics of the SAW chip. Because of small variations in characteristics, the SAW devices according to the present invention can be used as resonators, filters, delay lines, or others of higher quality than with conventional SAW devices.

BRIEF DESCRIPTION OF THE DRAWINGS

These and other objects, features, and advantages of the present invention will become more apparent upon a reading of the following detailed description and drawings, in which.

DESCRIPTION OF THE EMBODIMENTS

Preferred embodiments according to the present invention will be described below while referring to the attached drawings.

Figure 1:
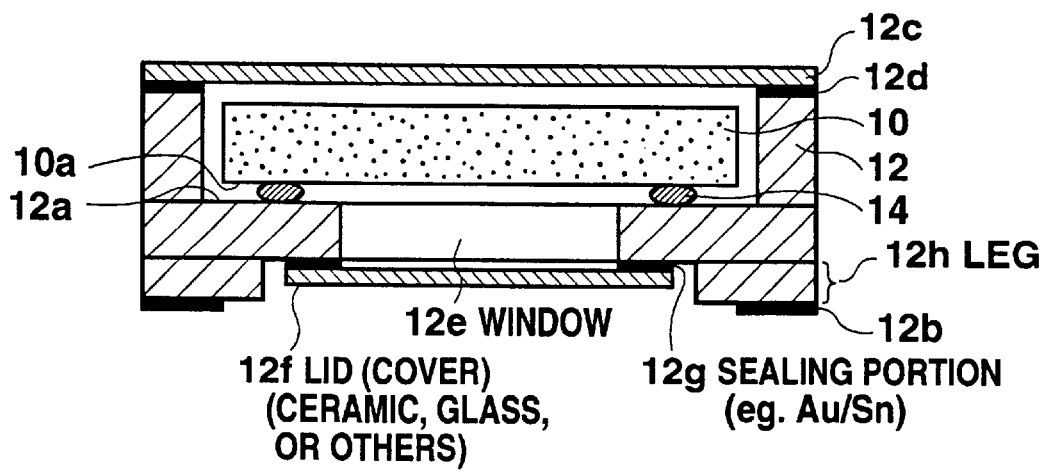
FIG. 1 is a cross-sectional view illustrating a surface-acoustic-wave (SAW) device according to a first embodiment of the present invention.

FIG. 1 is a cross sectional view illustrating the configuration of a SAW device according to a first embodiment of the present invention. This embodiment is characterized by a package 12 with a window 12e. The window 12e is formed to introduce gas onto the electrode formed surface 10a of a SAW chip 10 along the die attachment surface 12a from the outside. The opening area of the window 12e is narrower than the area of the opening formed on the upper side (in FIG. 1) to accommodate the SAW chip 10. After the gas has been introduced, the window 12e is sealed with the lid (cover) 12f formed of ceramic or glass. The space between the lid 12f and the package 12 is sealed with gold/tin alloy, solder, resin, or glass. In consideration of the frequency stability, gold, tin, or glass is preferable for the sealing portion 12g.

In the embodiment, the package has a three-layered structure. The three layered structure is formed by piling up a rectangular frame (with no bottom) forming the walls of the recess for accommodating the SAW chip 10, a flat plate having a die attachment surface 12a, and a leg 12h of which the end has footprints 12b and by securely fixing them together. The height of the leg 12h is larger than the total of the thickness of the lid 12f and the thickness of the sealing portion 12g.

In the fabrication of the SAW device in this embodiment, a package 12 with a window 12e and a SAW chip 10 having a predetermined conductor arrangement are first prepared. Preferably, the SAW chip 10 has a conductor arrangement on the electrode conductors formed surface 10a as shown in FIG. 2.

Figure 2:
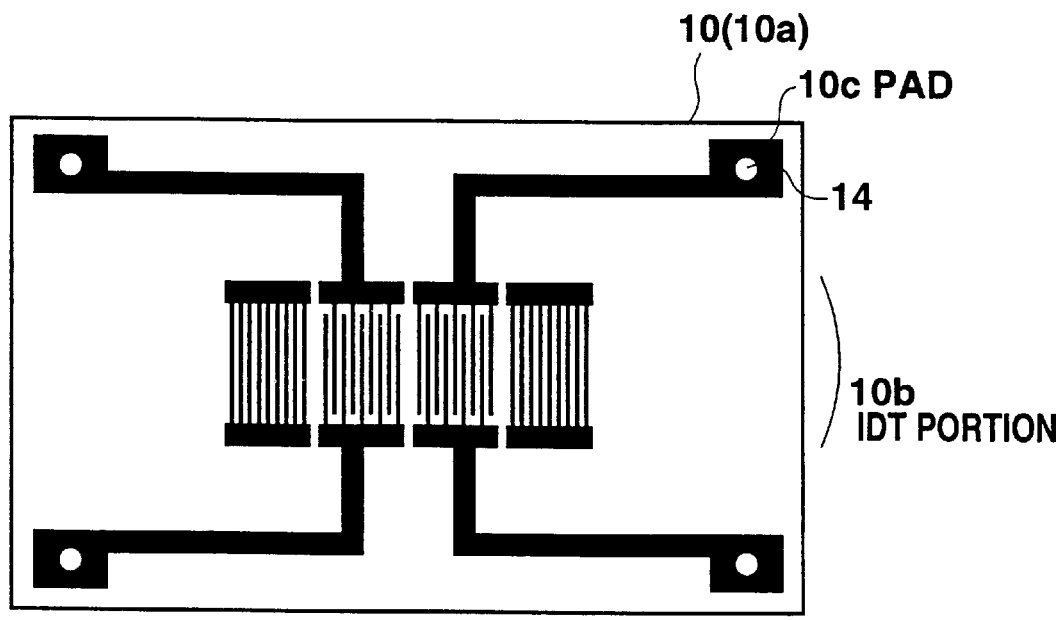
FIG. 2 is a plan view schematically illustrating a conductor arrangement on an electrode formed surface in the first embodiment.

Referring to FIG. 2, the interdigital electrode pairs formed on the middle portion of the electrode formed surface 10a transmit and receive surface acoustic waves, respectively. The interdigital electrode pairs configure the so-called IDT, together with side electrodes that reflect surface acoustic waves transmitted from the interdigital electrodes. The IDT portion 10b is electrically connected to pads 10c formed on the four corners of the electrode formed surface 10a by means of the conductors on the electrode formed surface 10a. The pads 10c are electrically connected and mechanically fixed to the pads 12i (refer to FIG. 3) on the die attachment surface 12a. The pads 12i are formed on the four corners of the die attachment surface 12a. The area of each pad 12i is larger than the area required for connection to the pad 10c (or the bump 14).

Next, flip-chip assembling (or face-down bonding) is performed to the die attachment surface 12a of the SAW chip 10. That is, as shown in FIG. 2, bumps 14, preferably made of gold, are disposed on the pads 10c, respectively. The SAW chip 10 is inserted into the recess of the package 12 through the upper opening, with the electrode formed surface 10a downward in FIG. 1. The intermediate structure is subjected to heating, pressure, or ultrasonics. Thus, the pads 10c and 12i are interconnected and fixed to the bumps 14. After this process, the IDT portion lob of the SAW chip 10 is electrically connected to the footprint 12b via the pads 10c, the bumps 14, the pads 12i, and conductors (not shown).

Figure 4:
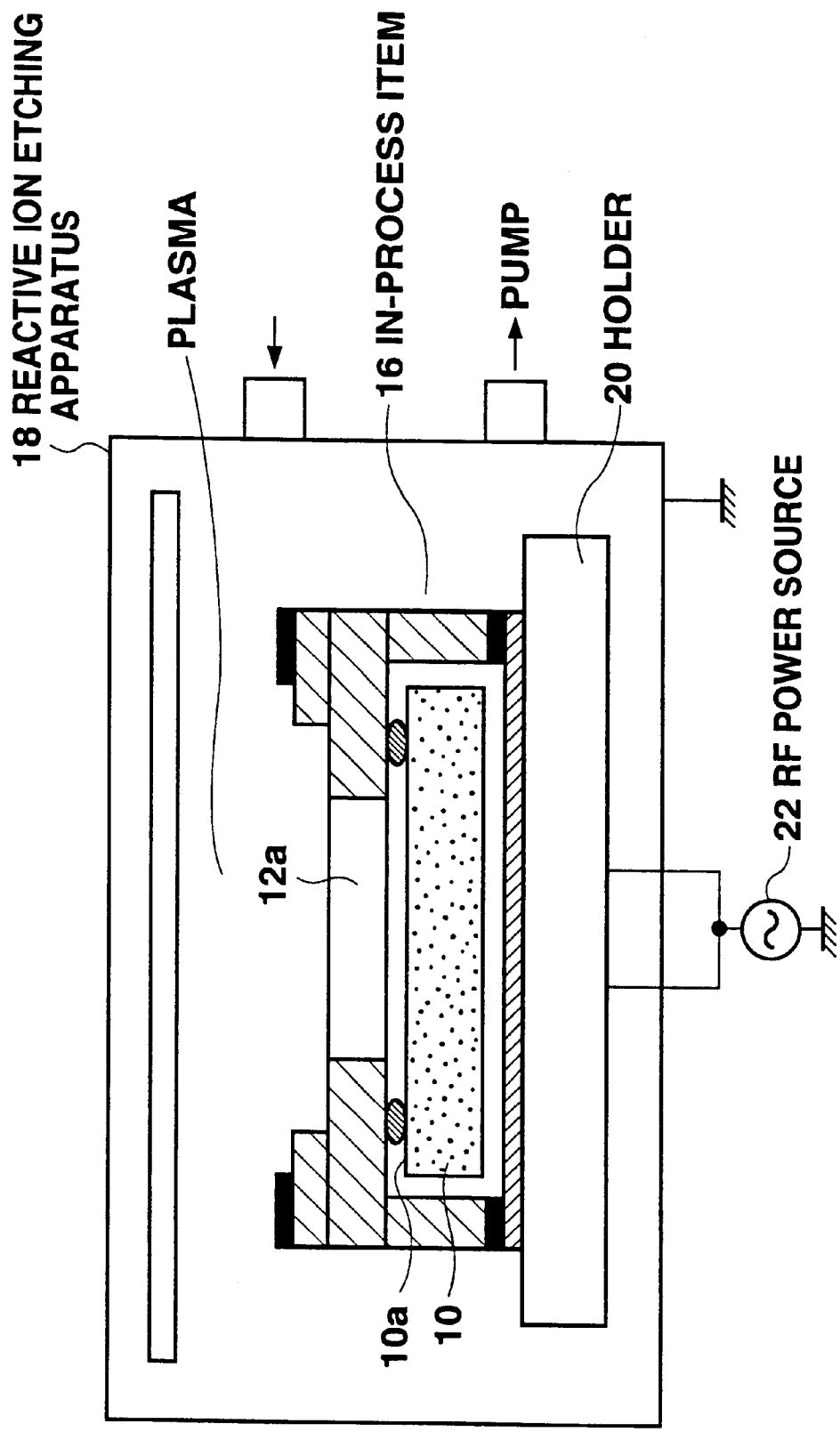
FIG. 4 is a cross-sectional view schematically illustrating a stage for a characteristics adjustment step in the first embodiment.

This embodiment is characterized by the characteristic adjustment step after the bump connection and fixture. FIG. 4 illustrates a stage where the center frequency or the like is adjusted through reactive ion etching. In this step, an inprocess item 16 is first placed on the holder 20 of parallel plate reactive ion etching equipment 18. The radio-frequency power source 22 applies a radio-frequency power to the holder 20. In such a condition, when an etching gas, e.g. fluorine gas is introduced into the etching equipment 18, plasma is generated due to discharge. The electrode formed surface 10a of the SAW chip 10 is etched by the plasma through the window 12e. In order to etch the SAW chip 10 being formed of, for example, a quartz crystal substrate, $CF_4$ is used as the etching gas. The etching causes the characteristic, e.g. the center frequency of the in-process item 16 to be changed.

Hence, if the level of adjustment of characteristics (or characteristics adjustment amount) or the characteristics to be obtained after adjustment (or target characteristics) is known, the characteristics of an in-process item 16 can be adjusted by suitably determining or controlling the software (type of etching gas, gas flow, power, temperature, pressure, and the like) related to the etching. Specifically, after the flip-chip mounting step and before the beginning of etching, the characteristics of the in-process item 16 are measured with a measuring apparatus (not shown) and are then compared with target characteristics. Then, the software regarding etching is suitably determined or controlled according to the comparison results. If the characteristics can be measured over etching or if etching can be resumed after the etching is temporarily stopped to measure the characteristics, the etching may be performed by determining the characteristics adjustment amount in real time or in compliance with real time.

After the characteristics adjustment step, the window 12e is closed with the lid 12f. Preferably, at the same time, the opening for chip accommodation may be closed with the lid 12c. Such a simplification of the step reduces production costs. To seal two portions simultaneously, it is preferable that the lids 12c and 12f and the sealing portions 12d and 12g are formed of the same or similar substances. However, this simplified step is not essential for the present invention. For example, for the in-process item 16 shown in FIG. 4, the opening for chip accommodation is sealed with the lid 12c before the characteristics adjustment step.

Figure 3:
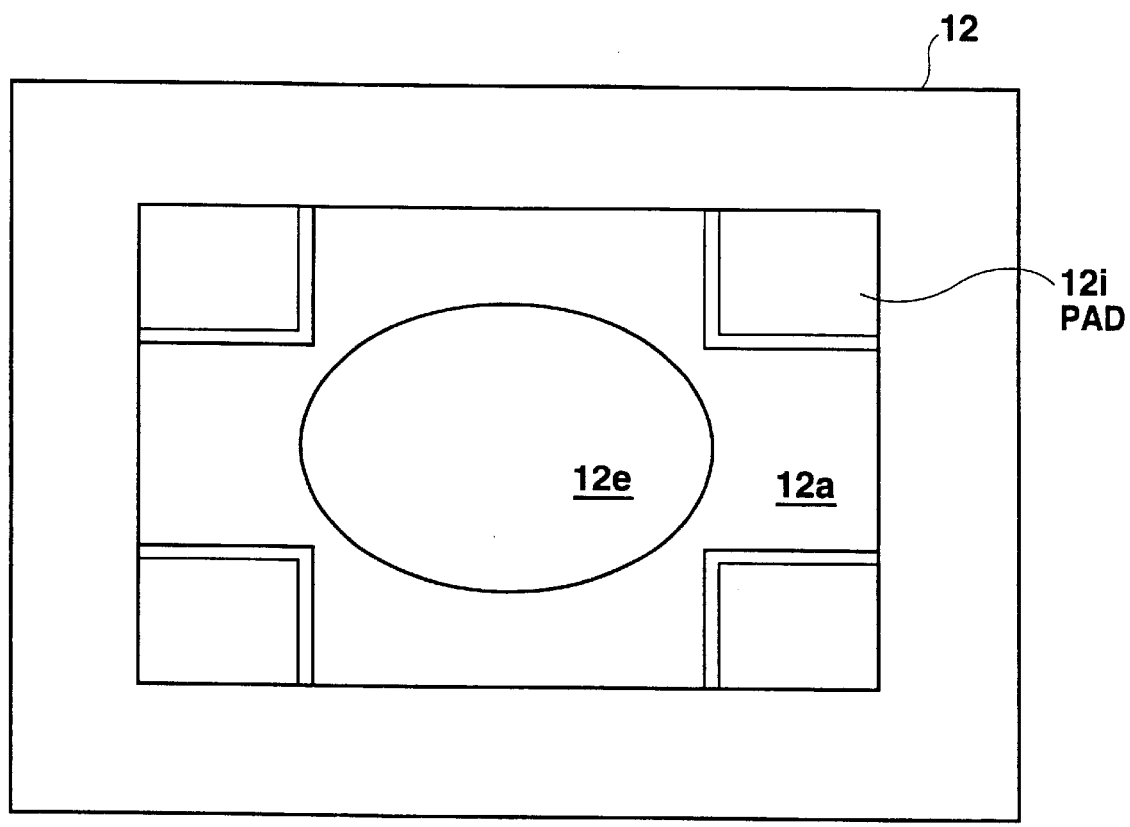
FIG. 3 is a plan view schematically illustrating conductor arrangement on a die attachment surface in the first embodiment.

In the present embodiment, a fluorine series etching gas is introduced via the window 12e, so that the electrode formed surface 10a of the SAW chip 10 is subjected to reactive ion etching to adjust the characteristics thereof. Hence, characteristics variations caused by variations in fabrication conditions can be avoided on the way of the fabrication and thus the product quality and yields can be effectively improved. In the present embodiment, the window 12e, as shown in FIG. 3, has a smaller opening area than that of the opening for chip accommodation. Hence, although reactive ion etching which often provides a relative high etching rate is performed, the etching rate is suppressed to a level at which the characteristic, e.g. the center frequency of the pass band, of the in-process item 16 can be easily controlled. Therefore, the characteristics can be accurately and easily adjusted even when producing SAW devices for use at relatively high frequencies.

The window 12e is closed with the lid 12f. When the step of sealing the window 12e with the lid 12f and the step of sealing the opening for chip accommodation with the lid 12c are carried out at the same time, the fabrication step can be simplified. In the present embodiment, because the window 12e is sealed with the lid 12f, the lid 12f (plus the sealing portion 12g) may protrude from the lower surface of the package 12. However, since the legs 12h are thicker than the protrusion, external connection and fixture can be performed with ease. Also, since the lid 12f is itself relatively thin, thickening caused by the leg 12h is not serious (for clarity, the lid 12f and the sealing portion 12g are not drawn to scale in FIG. 1).

When a substance capable of transmitting light or electromagnetic radiation, such as glass, is used for the lid 12f, the characteristics of a SAW device can be adjusted after the window 12e is sealed with the lid 12f, so that the characteristics change occurring in the step of sealing with the lid 12f can be compensated. Further, before the window 12e is sealed with the lid 12f, the electrode formed surface 10a of the SAW chip 10 may be selectively irradiated with focused light or electromagnetic radiation to partially increase the temperature of the conductor or insulating film on the electrode formed surface 10a. Then, the conductor or insulating film is changed in quality so that the device characteristics can be adjusted. Details of the film quality changing method is described above.

Figure 5:
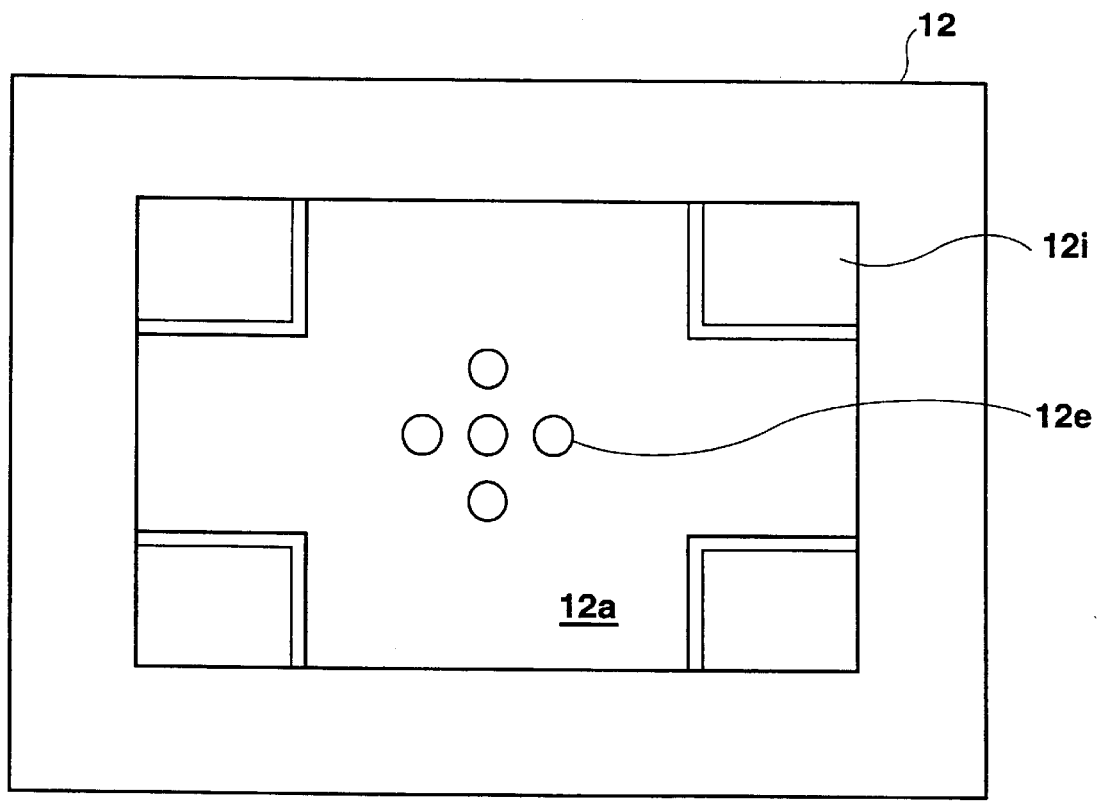
FIG. 5 is a plan view schematically illustrating a conductor arrangement on a die attachment surface in a second embodiment of the present invention.

FIG. 5 illustrates a window 12e according to the second embodiment of the present invention. A window is divided into plural (e.g. five) windows 12e, each of which is smaller than the window shown in FIG. 3. In the present invention, by setting the shape, size and number of the window(s), the etching rate suppressing effect can be improved.

Figure 6:
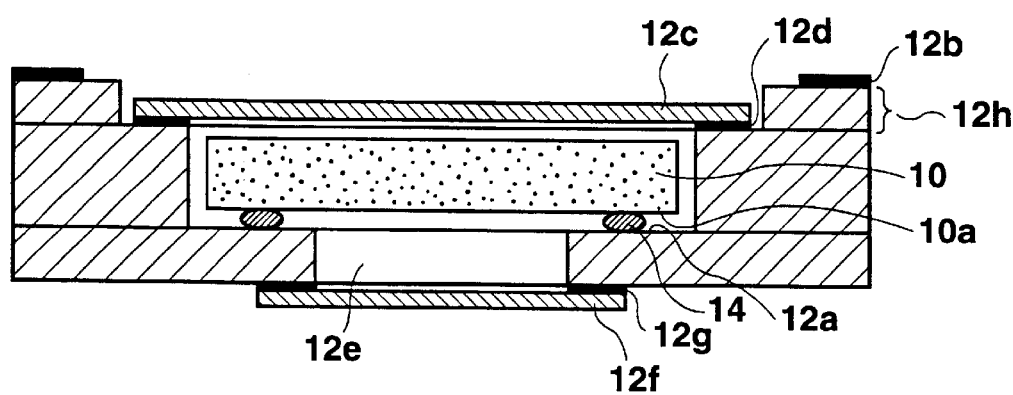
FIG. 6 is a cross-sectional view illustrating the configuration of a SAW device according to a third embodiment of the present invention.
Figure 7:
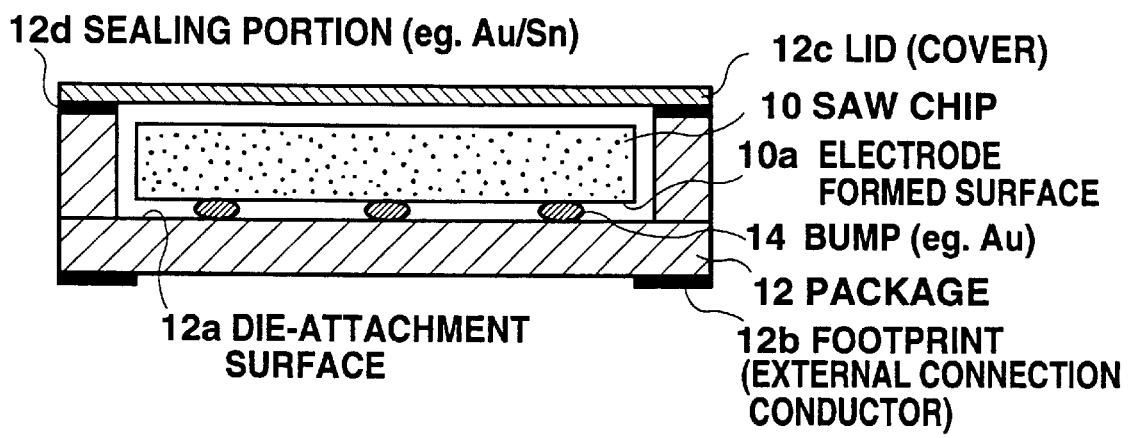
FIG. 7 is a cross-sectional view illustrating the schematic configuration of a flip-chip mounted SAW device.

FIG. 6 illustrates the configuration of a SAW device according to the third embodiment of the present invention. In this embodiment, the legs 12h are disposed on the same side as the opening for chip accommodation and the lid 12c. The third embodiment can provide a similar effect to that in the first embodiment.

The parallel plate reactive etching equipment 18 is used in the above embodiments. However, according to the present invention, other reactive ion etching equipment and other etching methods may be utilized. Which of the substrate or electrodes are etched depends on suitable selection of the etching gas and other software. Moreover, according to the present invention, the characteristics adjustment can be performed by various methods and the methods may not be etching. For example, a gas to form a film relating to (enhancing or resisting) a surface-acoustic-wave propagation may be introduced onto the electrode formed surface of a SAW chip. Such a film can be formed by using deposition technique such as CVD. The beam irradiation used in the previous proposal may be applied to perform the characteristic adjustment by changing the quality of electrodes or insulation films by the irradiation. A portion slightly lowered or thinned to other portions may be formed on a partial surface of the package 12, that is, a portion adjacent to the window 12e. Thus, a recess which accepts the lid 12f (and the sealing portion 12g ) is provided to avoid the lid 12f protruding from the surface of the package 12. Various modifications can be applied to the shape of the package 12 and the arrangement of the lid 12f.

What is claimed is:

1. A method of fabricating a surface-acoustic-wave (SAW) device comprising:

a mounting step of providing an in-process item by flip-chip mounting a SAW chip within a package, said package having a die attachment surface in which a window for characteristics adjustment is provided; and a first adjustment step of adjusting characteristics of the in-process item by an adjustment operation through said window, said first adjustment step including a substep of adjusting characteristics of the in-process item by introducing a gas into said package through said window, wherein said gas introduced into said package in said first adjustment step is selected from the group consisting of a gas for etching a substrate of said SAW chip, a gas for etching electrodes on said SAW chip, a gas for changing or adjusting the quality of the electrodes of an insulator film on said SAW chip, a gas for forming a film related to SAW propagation in said SAW chip on a surface of said SAW chip, and a combination of two or more of said gases, wherein said window has an opening smaller than another opening for chip accommodation to house said SAW chip within said package in said mounting step.

2. The method defined in claim 1, wherein in place of said window a set of plural windows is provided.

3. The method defined in claim 1, further comprising a second adjustment step of adjusting characteristics of said in-process item by portion-selectively irradiating an electrode formed surface of said SAW chip with light or electomagnetic waves through said window to cause a temperature rise at selected portion of said electrode formed surface.

4. The method defined in claim 1, further comprising a first sealing step of sealing said window with a lid after said first adjustment step.

5. The method defined in claim 4, comprising:

a second adjustment step for adjusting characteristics of the in-process item by portion-selectively irradiating said electrode formed surface of said SAW chip with light or electromagnetic radiation through said lid, said lid being formed of a light or electromagnetic radiation transparent material, to cause a temperature rise at selected portion of said electrode formed surface, said second adjustment step performed after the execution of at least said first sealing step.

6. The method defined in claim 4, wherein said package has an opening for chip accommodation through which said SAW chip is inserted into said package; wherein said SAW chip is inserted into said package through the opening in said mounting step; and wherein said first sealing step is performed concurrently with a second sealing step in which said opening for chip accommodation is sealed with a lid.

7. The method defined in claim 5, wherein said package has an opening for chip accommodation through which said SAW chip is inserted into said package; wherein said SAW chip is inserted into said package through the opening in said mounting step; and wherein said first sealing step is performed concurrently with a second sealing step in which said opening for chip accommodation is sealed with a lid for accommodation opening.

8. The method defined in claim 1, further comprising a measurement step of measuring characteristics of an in-process item to determine the characteristics adjustment amount of said in-process item, said measurement step being performed before at least said first adjustment step after said mounting step.

9. The method defined in claim 4, wherein said package has, on the side of said window, legs to be electrically connected and mechanically fixed to an external circuit, the thickness of said lid being smaller than the height of said legs.

* * * * *